United States Patent
Lee et al.

(10) Patent No.: US 7,297,636 B1
(45) Date of Patent: Nov. 20, 2007

(54) METHODS FOR FABRICATING DEVICE FEATURES HAVING SMALL DIMENSIONS

(75) Inventors: Doug H. Lee, Poughquag, NY (US); Andreas Knorr, Wappingers Falls, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/669,389

(22) Filed: Jan. 31, 2007

(51) Int. Cl.
*H01L 21/302* (2006.01)

(52) U.S. Cl. ............... 438/706; 438/618; 438/689; 438/671; 257/E21.305

(58) Field of Classification Search ............... 438/706, 438/618, 689, 671
See application file for complete search history.

(56) References Cited

U.S. PATENT DOCUMENTS

| | | | |
|---|---|---|---|
| 6,372,653 B1* | 4/2002 | Lou et al. | 438/706 |
| 6,919,168 B2* | 7/2005 | Hwang et al. | 430/318 |
| 2007/0020936 A1* | 1/2007 | Abatchev et al. | 438/689 |

* cited by examiner

*Primary Examiner*—Asok K. Sarkar
*Assistant Examiner*—Victor V. Yevsikov
(74) *Attorney, Agent, or Firm*—Ingrassia Fisher & Lorenz, P.C.

(57) ABSTRACT

Methods for fabricating devices having small feature sizes are provided. In an exemplary embodiment, a method comprises forming a patterned first mask layer overlying a subject material layer and isotropically etching the patterned first mask layer. A second masking layer is deposited overlying the patterned first mask layer and the isotropically-etched patterned first mask layer is exposed. The isotropically-etched patterned first mask layer is removed and the subject material layer is etched to form a feature therein.

17 Claims, 3 Drawing Sheets

METHODS FOR FABRICATING DEVICE FEATURES HAVING SMALL DIMENSIONS

FIELD OF THE INVENTION

The present invention generally relates to semiconductor processing, and more particularly relates to methods for fabricating devices having small features.

BACKGROUND OF THE INVENTION

Semiconductor devices such as integrated circuits are generally fabricated by the repeated application of a photolithographic process. A photosensitive material is applied to the surface of a semiconductor substrate, which may include layers of dielectric materials, polycrystalline silicon, and various metals, and a radiation source is used to transfer the pattern of a lithographic mask or reticle onto the photosensitive material. The patterned photosensitive material is then used as a process mask to process the semiconductor substrate or one of the layers on the substrate. The process mask may be used, for example, as an etch mask or as an ion implantation mask.

As the number of individual devices incorporated in the design of a semiconductor integrated circuit increases, there is a growing need to decrease the minimum feature size, that is, the minimum width, the minimum space between individual elements of the devices, the minimum widths of holes or vias, and the like. As the minimum feature size decreases, especially when the minimum feature size is less than the wavelength of the radiation source, it becomes increasingly difficult to adequately resolve the features because of diffraction and interference effects. Optical distortion causes a loss of the anticipated one-to-one correspondence between the image on the mask and the image created in the patterned photosensitive material. While extreme ultraviolet (EVU) lithography and electron-beam lithography may be used to pattern photoresists with small feature size, such processes are complex and very expensive.

Accordingly, it is desirable to provide improved methods for fabricating semiconductor devices that have small feature sizes. In addition, it is desirable to provide methods for etching small features into a subject material layer. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method for fabricating a device in accordance with an exemplary embodiment of the invention is provided. The method comprises forming a patterned first mask layer overlying a subject material layer and isotropically etching the patterned first mask layer. A second masking layer is deposited overlying the isotropically-etched patterned first mask layer and the isotropically-etched patterned first mask layer is exposed. The isotropically-etched patterned first mask layer is removed and the subject material layer is etched to form a feature therein.

A method for fabricating a semiconductor device having a feature with a predetermined dimension in accordance with an exemplary embodiment of the invention is provided. The method comprises patterning a carbon-comprising layer that overlies a subject material layer to form a carbon-comprising structure overlying the subject material layer. The carbon-comprising structure is isotropically etched to form a carbon-comprising element that has a dimension that is about equal to the predetermined dimension. A hard masking layer is deposited overlying the carbon-comprising element and the subject material layer and a portion of the hard masking layer is removed to expose the carbon-comprising element. The carbon-comprising element is removed and the subject material layer is etched to form a feature having a dimension that is substantially equal to the predetermined dimension.

A method for etching a small feature into a subject material layer in accordance with an exemplary embodiment of the invention is provided. The method comprises forming a carbon-comprising layer overlying the subject material layer and forming a patterned mask overlying the carbon-comprising layer. The carbon-comprising layer is etched using the patterned mask as an etch mask and a carbon-comprising element is formed overlying the subject material layer. The carbon-comprising element is trimmed and a hard mask layer is formed overlying the carbon-comprising element and the subject material layer. A portion of the hard mask layer is removed to expose a surface of the carbon-comprising element. The carbon-comprising element is removed from the subject material layer and a patterned hard mask is formed. The subject material layer is etched using the patterned hard mask as an etch mask.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
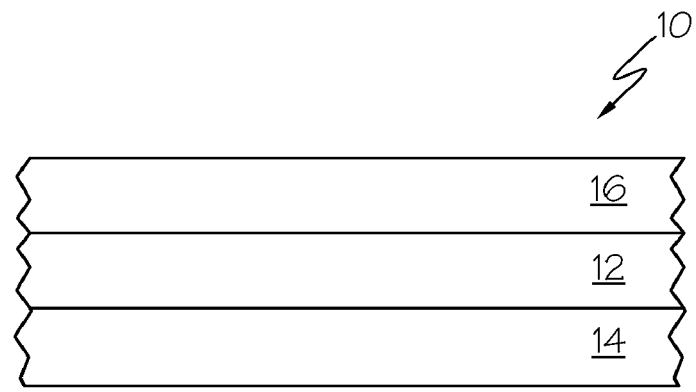
FIGS. 1-9 illustrate, in cross section, method steps for fabricating a semiconductor device in accordance with an embodiment of the invention.

FIGS. 1-9 illustrate, in cross section, method steps in accordance with an embodiment of the invention for fabricating a semiconductor device 10. Many of the steps employed in the fabrication of semiconductor devices are well known and so, in the interest of brevity, some of those conventional steps will only be mentioned briefly herein or will be omitted entirely without providing the well known process details. As illustrated in FIG. 1, the method starts with a subject material layer 12. The subject material layer 12 is any material layer in which small feature sizes are to be etched. For example the subject material layer 12 may be an insulating layer comprising an oxide or nitride material, or may be a semiconductor material layer, for example, a silicon-comprising, polysilicon-comprising, or gallium arsenide-comprising layer. In an exemplary embodiment of the invention, subject material layer 12 may be a stand-alone material layer. In another exemplary embodiment, the subject material layer 12 may be disposed on a substrate 14. The substrate can be a bulk semiconductor wafer or a semiconductor on insulator (SOI) substrate (not illustrated), for example. The substrate can be, for example, a silicon wafer, and may also include dielectric layers, metal layers, impurity doped regions in the substrate, and the like, as are well known to those of skill in the semiconductor art.

To form a small feature or features within the subject material layer, the subject material layer will be etched. To accomplish this, a mask layer 16 is formed overlying subject material layer 12. In general terms, mask layer 16 is a material that can be patterned by a directional etch using a resist technique and isotropically etched (wet or dry) selective to subject material layer 12, and removable selective to hard mask layer 26, discussed in more detail below. In an exemplary embodiment, the mask layer 16 is formed substantially of carbon and can also comprise about 0 to about 30% hydrogen. The mask layer 16 also may be a polymerized carbon layer. The mask layer 16 may be formed overlying subject material layer 12 by chemical vapor deposition (CVD), plasma vapor deposition (PVD), atomic layer deposition (ALD), spin-on deposition, and the like, and can be deposited to a thickness in the range of about 50 to about 1000 nm.

Figure 2:
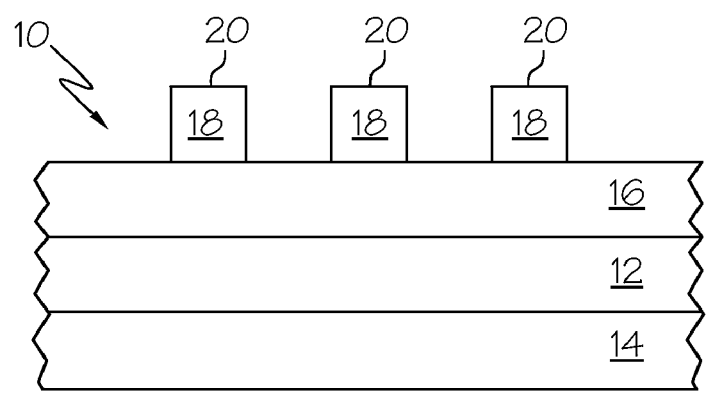

Referring to FIG. 2, a layer of photosensitive material 18, such as a layer of photoresist, is applied to the surface of the mask layer 16. As is well known to those of skill in the art, adhesion promoters and/or antireflective coatings (not illustrated) may be applied to the mask layer before the photosensitive material is applied. Photosensitive material 18 can be selected from the well known and commercially available photoresist materials. The photoresist then is patterned using conventional photolithography methods to form photoresist structures 20.

Figure 3:
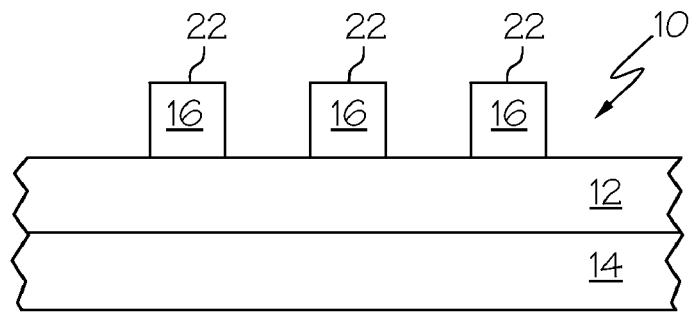

The mask layer 16 is etched using photoresist structures 20 as an etch mask to form at least one mask element 22, as illustrated in FIG. 3. While FIG. 3 illustrates three mask elements 22 overlying subject material layer 12, it will be appreciated that one or any other number of mask elements can be formed. The mask layer can be etched by, for example, an oxygen-based plasma. The photoresist is removed during etching of the mask layer.

Figure 4:
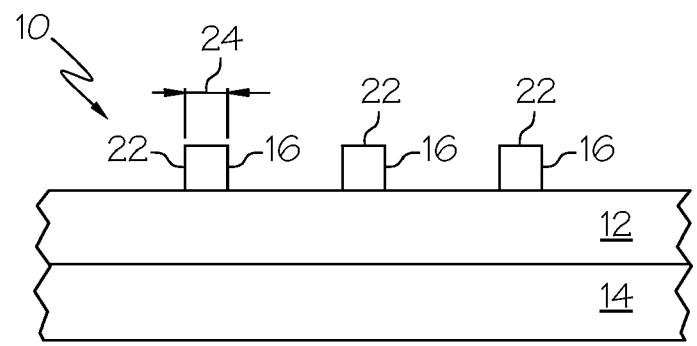

The method continues with the lateral "trimming" of mask elements 22, as illustrated in FIG. 4. The trimming is achieved with an isotropic etch process that is a wet etch or, preferably, a dry isotropic etch such as, for example, an oxygen-based plasma etch. The mask elements 22 are trimmed so that they have a dimension indicated by double-headed arrow 24, that is, a width, a length perpendicular to the width (in the direction into the page), or both, that is substantially the same as a dimension(s) (width and/or length) of the feature to be etched into the subject material layer 12.

Figure 5:
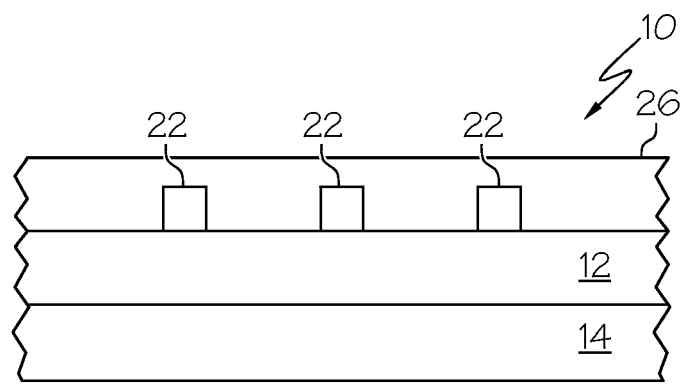
Figure 6:
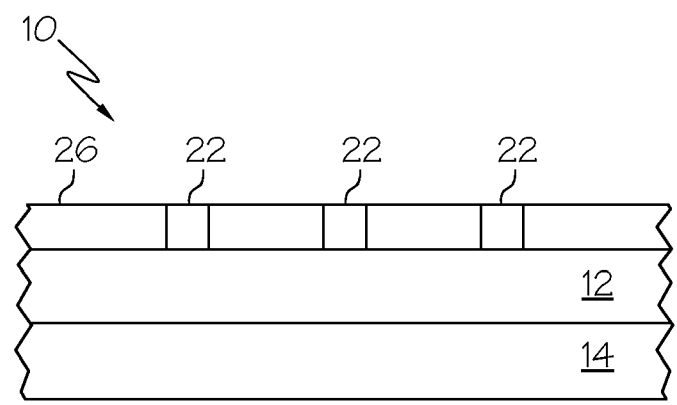

A blanket hard mask layer 26 is deposited overlying the subject material layer 12. The hard mask layer 26 can be, for example, a layer of silicon nitride. The hard mask layer, if silicon nitride, can be deposited, for example, by PECVD from the reaction of dichlorosilane and ammonia. Those of skill in the art will understand that other dielectric materials other than silicon nitride, such as silicon oxide or silicon carbide, can be deposited as the hard mask material. In one embodiment of the invention, the mask elements 22 remain exposed after deposition of the hard mask layer 26. In this regard, depending on a height of the mask elements 22, the hard mask layer 26 can be deposited to a thickness so that at least a surface of the mask elements 22 remain exposed. In another exemplary embodiment of the invention, as illustrated in FIG. 5, the hard mask layer 26 can be deposited overlying the subject material layer 12 and the mask elements 22 and a portion of the hard mask layer 26 subsequently is removed to expose the mask elements, as illustrated in FIG. 6. The hard mask layer 26 can be etched back, for example, by plasma etching in a $CHF_3$, $CF_4$, or $SF_6$ chemistry or can be removed by chemical mechanical polishing (CMP). In another exemplary embodiment, the hard mask layer 26 can be overetched to insure exposure of the mask elements 22.

Figure 7:
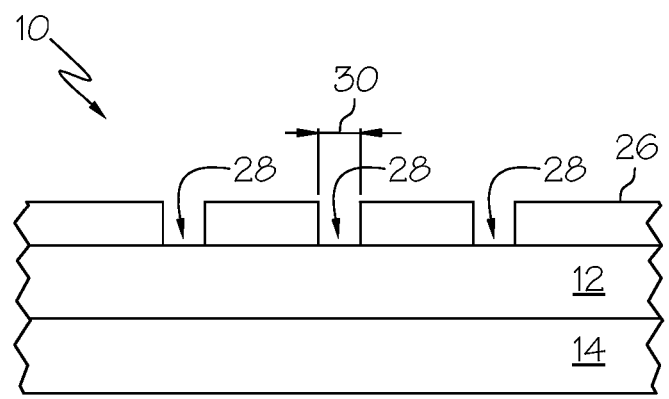

The method continues with the removal of the mask elements 22, as illustrated in FIG. 7. Removal of the mask elements 22 results in a pattern of features 28 in the hard mask layer 26. Features 28 have a dimension, indicated by double-headed arrow 30, that is, a width, a length perpendicular to the width (into the page), or both, that is substantially the same as the dimension(s) 24 (width and/or length) of the mask elements 22 removed.

Figure 8:
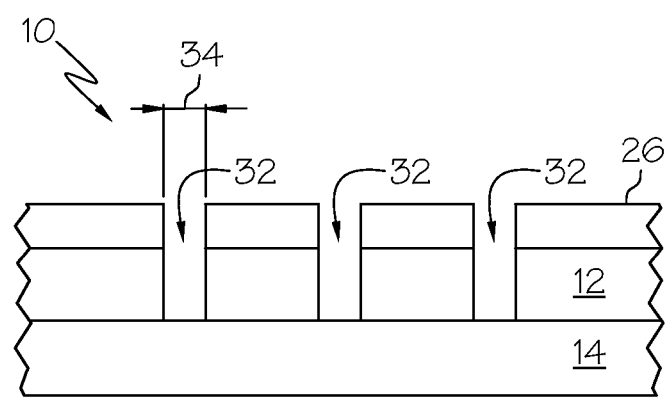

Referring to FIG. 8, after removal of the mask elements 22, the subject material layer 12 is etched using the patterned hard mask 26 as an etch mask. In this regard, features 32 are formed within the subject material layer 12 having a dimension(s), indicated by double-headed arrow 34, that is substantially the same as the small dimension(s) 24 of the trimmed mask elements 22. As will be appreciated by those of skill in the art, features 32 can be holes or vias etched within a portion of or completely through subject material layer 12 or can be lines or other features etched within subject material layer 12. The subject material layer 12 can be etched using any suitable etch chemistry. For example, if the subject material layer 12 is an insulating layer formed of silicon oxide or silicon nitride, subject material layer 12 can be anisotropically etched by reactive ion etching (RIE) using a $CHF_3$, $CF_4$, $C_4F_8$, or $SF_6$ containing chemistry.

Figure 9:
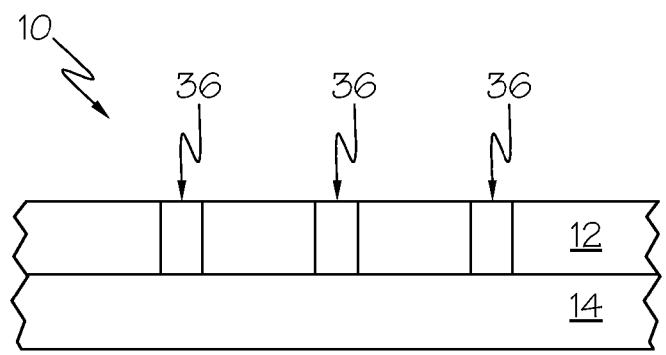

Referring to FIG. 9, after formation of features 32 in subject material layer 12, the patterned hard mask 26 can be removed by dry etching, wet etching, or CMP, as described above. Using conventional methods such as, for example, PVD, CVD, ALD, or electroplating, conductive material then can be deposited within the features to form conductive lines and/or contacts 36. The conductive material can be a metal such as, for example, copper, aluminum, tantalum, or the like, or alloys of any metal, or can be any other conductive material. A blanket layer of the conductive material is deposited within the features and overlying subject material layer 12 until the features are filled. Any excess conductive material formed on the subject material layer 12 can be removed by etching or by CMP until a surface of subject material layer 12 is exposed or until a desired thickness of the conductive material in the features is realized.

Accordingly, methods for forming small features in semiconductor devices have been provided. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a device, the method comprising the steps of:

forming a patterned first mask layer overlying a subject material layer;

isotropically etching the patterned first mask layer;

depositing a second masking layer overlying the isotropically-etched patterned first mask layer;

exposing the isotropically-etched patterned first mask layer;

removing the isotropically-etched patterned first mask layer; and etching the subject material layer to form a feature within the subject material layer.

2. The method of claim 1, wherein the step of forming a patterned first mask layer comprises the step of forming a pattered carbon-comprising layer having a hydrogen content in a range of about 0 to about 30%.

3. The method of claim 1, wherein the step of forming a patterned first mask layer comprises the step of forming the patterned first mask layer by etching a first mask layer using a patterned photoresist as an etch mask.

4. The method of claim 1, wherein the step of forming a patterned first mask layer overlying a subject material layer comprises the step of forming the patterned first mask layer overlying an insulating layer.

5. The method of claim 1, wherein the step of forming a patterned first mask layer overlying a subject material layer comprises the step of forming the patterned first mask layer overlying a semiconductor material layer.

6. The method of claim 1, wherein the step of forming a patterned first mask layer overlying a subject material layer comprises the step of forming the patterned first mask layer overlying a subject material layer that is disposed on a semiconductor substrate.

7. The method of claim 1, wherein the step of exposing the isotropically-etched patterned first mask layer is performed after the step of depositing a second masking layer overlying the patterned first mask layer.

8. The method of claim 7, wherein the step of exposing the isotropically-etched patterned first mask layer comprises the step of removing a portion of the second masking layer by chemical mechanical planarization or dry etching.

9. The method of claim 1, further comprising the steps of:
removing the second masking layer; and
depositing a conductive material within the feature of the subject material layer.

10. The method of claim 1, wherein the step of isotropically etching the patterned first mask layer comprises the step of forming a first mask element that has a dimension that is substantially equal to a dimension of the subsequently formed feature in the subject material layer.

11. A method for fabricating a semiconductor device having a feature with a predetermined dimension, the method comprising the steps of:

patterning a carbon-comprising layer that overlies a subject material layer to form a carbon-comprising structure overlying the subject material layer;

isotropically etching the carbon-comprising structure to form a carbon-comprising element that has a dimension that is about equal to the predetermined dimension;

depositing a hard masking layer overlying the carbon-comprising element and the subject material layer;

removing a portion of the hard masking layer to expose the carbon-comprising element;

removing the carbon-comprising element; and etching the subject material layer to form the feature having a dimension that is substantially equal to the predetermined dimension.

12. The method of claim 11, wherein the step of patterning a carbon-comprising layer that overlies a subject material layer to form a carbon-comprising structure overlying the subject material layer comprises the steps of:

depositing a photoresist overlying the carbon-comprising layer;

patterning the photoresist using photolithography;

etching the carbon-comprising layer using the patterned photoresist as an etch mask.

13. The method of claim 11, wherein the step of patterning a carbon-comprising layer that overlies a subject material layer to form a carbon-comprising structure overlying the subject material layer comprises the step of depositing the carbon-comprising layer having a hydrogen content in a range of about 0 to about 30% overlying the subject material layer.

14. The method of claim 11, wherein the step of patterning a carbon-comprising layer that overlies a subject material layer comprises the step of patterning a carbon-comprising layer that overlies an insulating layer.

15. The method of claim 11, wherein the step of patterning a carbon-comprising layer that overlies a subject material layer comprises the step of patterning a carbon-comprising layer that overlies a subject material layer disposed on a semiconductor substrate.

16. The method of claim 11, wherein the step of isotropically etching the carbon-comprising structure to form a carbon-comprising element comprises the step of isotropically etching the patterned carbon-comprising structure using an oxygen-based plasma.

17. The method of claim 11, further comprising the step of depositing a conductive material in the feature.

* * * * *